US012720674B2

(12) United States Patent
Wang et al.

(10) Patent No.: US 12,720,674 B2
(45) Date of Patent: Aug. 25, 2026

(54) ELECTRONIC DEVICE

(71) Applicant: Innolux Corporation, Miaoli County (TW)

(72) Inventors: Ju-Li Wang, Miaoli County (TW); Po-Yun Hsu, Miaoli County (TW); Ker-Yih Kao, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 189 days.

(21) Appl. No.: 18/809,368

(22) Filed: Aug. 20, 2024

(65) Prior Publication Data

US 2025/0106985 A1 Mar. 27, 2025

Related U.S. Application Data

(60) Provisional application No. 63/540,391, filed on Sep. 26, 2023.

(30) Foreign Application Priority Data

Jun. 24, 2024 (CN) ........................ 202410820627.5

(51) Int. Cl.
*H05K 1/02* (2006.01)
*H05K 1/11* (2006.01)
*H05K 1/181* (2026.01)

(52) U.S. Cl.
CPC ........... *H05K 1/0271* (2013.01); *H05K 1/112* (2013.01); *H05K 1/181* (2013.01); *H05K 2201/09036* (2013.01)

(58) Field of Classification Search
CPC .................................................. H05K 1/2071
USPC ........................................................ 361/760
See application file for complete search history.

(56) References Cited

U.S. PATENT DOCUMENTS 10,660,202 B1 5/2020 Yeh et al.
2015/0359098 A1* 12/2015 Ock ........................ H05K 1/14 29/842
2022/0216136 A1* 7/2022 Cheng .................. H10W 70/65
2023/0207498 A1 6/2023 Tang

* cited by examiner

*Primary Examiner* — Stanley Tso
(74) *Attorney, Agent, or Firm* — JCIPRNET

(57) ABSTRACT

An electronic device having a central area and a peripheral area surrounding the central area is provided. The electronic device includes a substrate, a through hole, a buffer layer, a first circuit structure, an electronic component and a first pad. The substrate has a first surface and a second surface opposite to the first surface. The through hole penetrates through the substrate and has a first through hole and a second through hole. The buffer layer covers the first surface, the second surface, an inner wall of the first through hole and an inner wall of the second through hole. The first circuit structure is disposed on the first surface. The first through hole corresponds to the central area, the second through hole corresponds to the peripheral area, and a width of the second through hole is greater than a width of the first through hole.

20 Claims, 7 Drawing Sheets

ELECTRONIC DEVICE

CROSS-REFERENCE TO RELATED APPLICATION

This application claims the priority benefits of U.S. provisional application Ser. No. 63/540,391, filed on Sep. 26, 2023, and China application serial no. 202410820627.5, filed on Jun. 24, 2024. The entirety of each of the above-mentioned patent applications is hereby incorporated by reference herein and made a part of this specification.

BACKGROUND

Technical Field

The disclosure relates to an electronic device, and particularly relates to an electronic device capable of mitigating a warping problem.

Description of Related Art

Electronic devices or spliced electronic devices including semiconductor components have been widely used in different fields such as communication, display, automobile or aviation, etc. Along with rapid development of electronic devices, electronic devices are developed towards a trend of lightness and thinness, so that demands of reliability or quality of electronic devices become higher.

SUMMARY

The disclosure is directed to an electronic device, which is adapted to mitigate a warping problem.

According to an embodiment of the disclosure, the electronic device has a central area and a peripheral area surrounding the central area. The electronic device includes a substrate, a through hole, a buffer layer, a first circuit structure, an electronic component and a first pad. The substrate has a first surface and a second surface opposite to the first surface. The through hole penetrates through the substrate and has a first through hole and a second through hole. The buffer layer covers the first surface, the second surface, an inner wall of the first through hole and an inner wall of the second through hole. The first circuit structure is disposed on the first surface. The electronic component is disposed on the first circuit structure and corresponds to the central area. The first pad is disposed on the second surface. The first pad is electrically connected to the electronic component through the through hole and the first circuit structure. The first through hole corresponds to the central area, the second through hole corresponds to the peripheral area, and a width of the second through hole is greater than a width of the first through hole.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
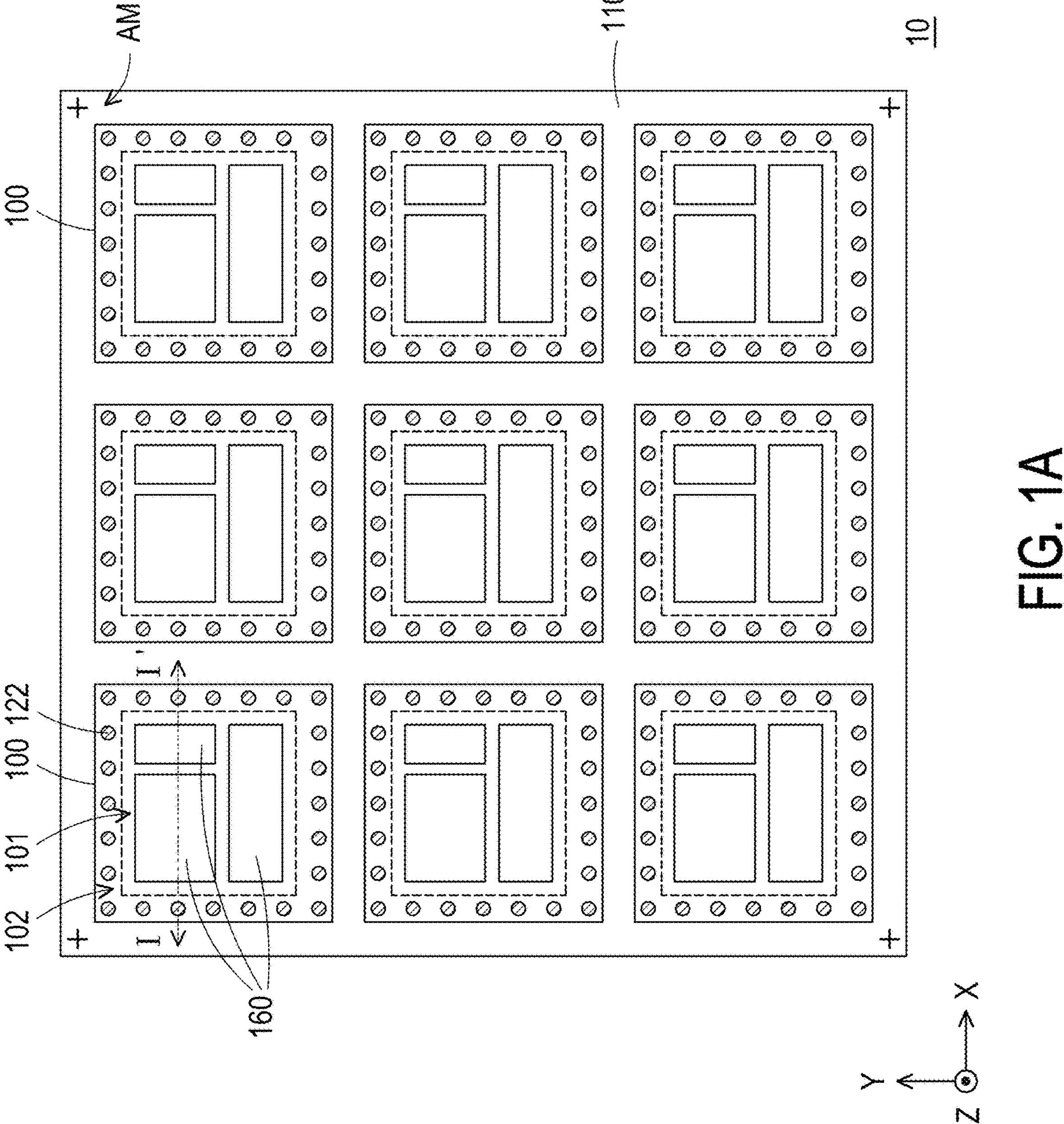
FIG. 1A is a schematic top view of an electronic device according to a first embodiment of the disclosure.

The disclosure may be understood by referring to the following detailed description with reference of the accompanying drawings. It should be noted that, in order to facilitate the reader's understanding and the conciseness of the drawings, the multiple drawings in the disclosure only depict a part of an electronic device, and specific elements in the drawings are not drawn according to actual scales. In addition, the number and size of each element in the figures are only for illustration, and are not used to limit the scope of the disclosure.

In the following description and claims, the words "have" and "include" are open-ended words, so they should be interpreted as "including but not limited to . . . ".

It should be understood that when an element or film layer is referred to as being "on" or "connected" to another element or film layer, the element or film layer may be directly on the other element or film layer, or directly connected to the other element or film layer, or there is an intervening element or film layer there between (an indirect situation). Conversely, when an element or film layer is referred to be "directly" on or "directly connected" to another element or film layer, there is no intervening element or film layer there between.

Although the terms "first", "second", "third" . . . may be used to describe various components, the components are not limited to these terms. These terms are only used to distinguish a single component from other components in the specification. The same terms may not be used in the claims, and the components may be described as first, second, third components . . . according to an order declared in the claims. Therefore, in the following description, the first component may be the second component in the claims.

In the text, the terms "about", "approximately", "substantially", and "roughly" generally mean within 10%, within 5%, within 3%, within 2%, within 1%, or within 0.5% of a given value or range. The numbers given here are approximate numbers, i.e., in the absence of specific descriptions of "about", "approximately", "substantially", and "roughly", the meanings of "about", "approximately", "substantially", and "roughly" may still be implied.

In some embodiments of the disclosure, terms related to bonding and connecting mentioned in the specification, such as "connected", "interconnected", etc., unless specifically defined, may mean that two structures are in contact with each other, or that two structures are not in contact with each other, but there are other structures located between the above two structures. The terms of bonding and connecting may also include a situation that both structures are movable or both structures are fixed. In addition, the term "coupling" include any direct and indirect electrical connection means.

In some embodiments of the disclosure, an optical microscope (OM), a scanning electron microscope (SEM), an α-step, an ellipsometer, or other suitable methods may be used to measure an area, a width, a thickness, or a height of each component, or a distance or spacing between components. Specifically, according to some embodiments, a scanning electron microscope may be used to obtain a cross-sectional structural image including the components to be measured, and measure the area, width, thickness, or height of each component, or the distance or spacing between components.

In the disclosure, definition of roughness judgment may be observed by SEM, on a concave-convex surface, it may be seen that peaks and valleys of surface undulations have a distance difference of 0.15 μm to 1 μm. The measurement of roughness judgment may include using SEM, transmission electron microscope (TEM), etc., to observe the surface undulations at a same appropriate magnification, and compare the undulations by taking samples of unit length (for example, 10 μm) to obtain the roughness range. Here, "appropriate magnification" refers to roughness (Rz) or average roughness (Ra) of at least one surface that may be seen at least 10 undulating peaks in the field of view at this magnification.

The electronic device disclosed herein may include a display device, an antenna device, a sensing device or a splicing device, but the disclosure is not limited thereto. The electronic device may be a bendable or flexible electronic device. The electronic device may, for example, include a liquid crystal light emitting diode; the light emitting diode may, for example, include an organic light emitting diode (OLED), a mini LED, a micro LED or a quantum dot (QD) light-emitting diode (which may be, for example, QLED, QDLED), fluorescence, phosphor or other suitable materials, and the materials may be arranged and combined in any manner, but the disclosure is not limited thereto. The antenna device may, for example, be a liquid crystal antenna, but the disclosure is not limited thereto. The splicing device may be, for example, a display splicing device or an antenna splicing device, but the disclosure is not limited thereto. The electronic device may have a peripheral system such as a driving system, a control system, a light source system, a layered system, etc. The electronic device may include electronic units, where the electronic units may include passive components and active components, such as capacitors, resistors, inductors, diodes, transistors, sensors, etc. It should be noted that the electronic device disclosed herein may be various combinations of the above-mentioned devices, but the disclosure is not limited thereto. The electronic device disclosed herein may be, for example, applied to a power module, a semiconductor packaging device, a display device, a light-emitting device, a backlight device, an antenna device, a sensing device, or a splicing device, but the disclosure is not limited thereto. The electronic device may include a system on a chip (SoC), a system in a package (SiP), an antenna in package (AiP), or various combinations of the above devices, but the disclosure is not limited thereto. It should be noted that the electronic device may be any combination of the above, but the disclosure is not limited thereto. The following illustrates the disclosure with reference to an electronic device, but the disclosure is not limited thereto.

It should be noted that the following embodiments may replace, reorganize, or mix features in several different embodiments to complete other embodiments without departing from the spirit of the disclosure. Features between embodiments may be mixed and matched as long as they do not violate the spirit of the disclosure or conflict with each other.

Reference will now be made in detail to exemplary embodiments of the disclosure, examples of which are illustrated in the accompanying drawings. Whenever possible, the same reference numerals are used in the drawings and the description to refer to the same or like parts.

Figure 1B:
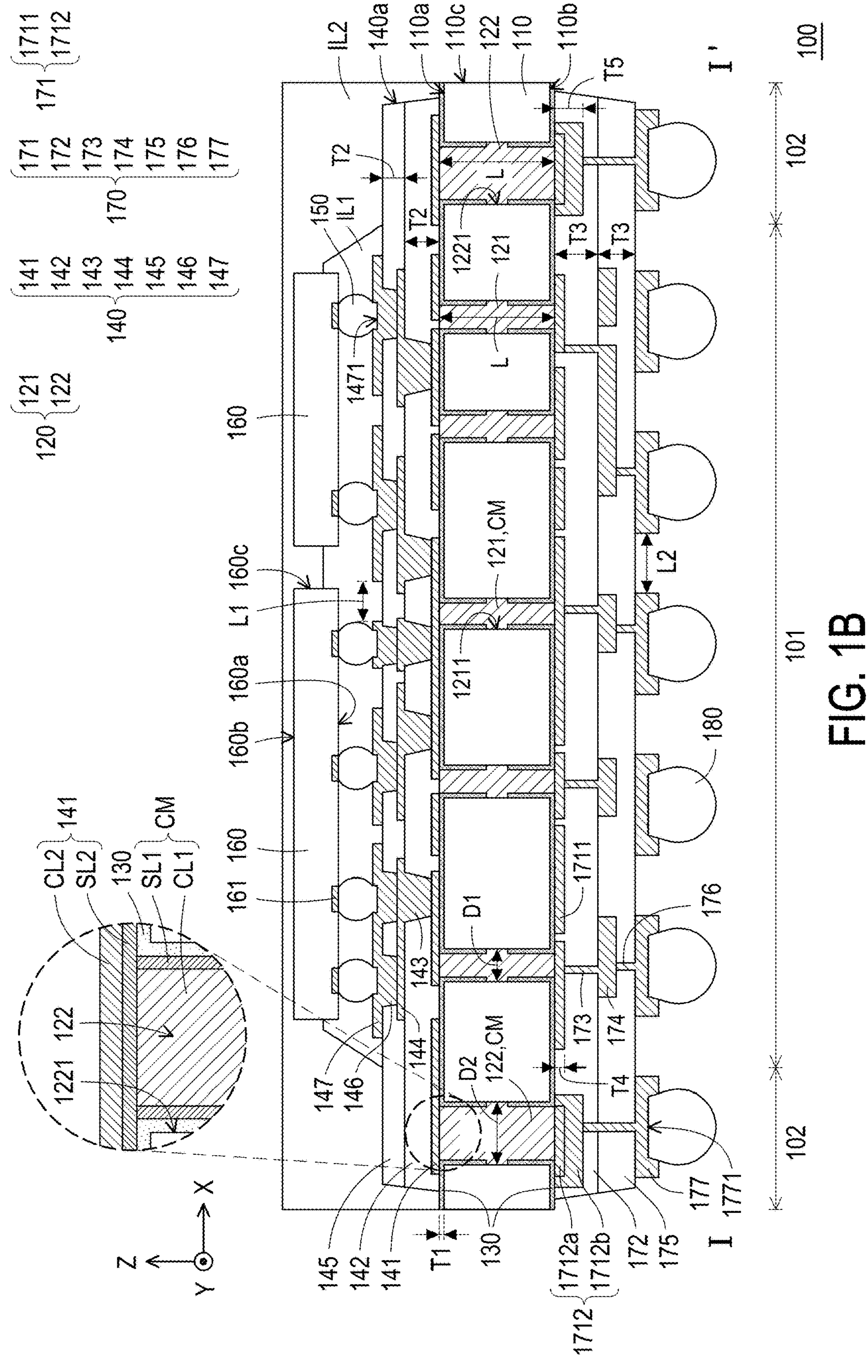
FIG. 1B is a schematic cross-sectional view of the electronic device of FIG. 1A along a section line I-I'.

FIG. 1A is a schematic top view of an electronic device according to a first embodiment of the disclosure. FIG. 1B is a schematic cross-sectional view of the electronic device of FIG. 1A along a section line I-I'. For the sake of clarity and convenience of description, FIG. 1A omits showing some components in the electronic device (for example, a buffer layer 130, a first circuit structure 140, a conductive element 150, a second circuit structure 170, first pads 180, a first insulating layer IL1, and a second insulating layer IL2, but the disclosure is not limited thereto).

Referring to FIG. 1A and FIG. 1B at the same time, an electronic device 10 of the embodiment has a plurality of electronic devices 100 (FIG. 1A schematically shows 9 electronic devices 100, but the disclosure is not limited thereto) and a plurality of alignment marks AM. Each electronic device 100 has a central area 101 and a peripheral area 102 surrounding the central area 101, and each electronic device 100 may include a substrate 110, a through hole 120, a buffer layer 130, a first circuit structure 140, a conductive element 150, an electronic component 160, a second circuit structure 170, a first pad 180, a first insulating layer IL1, and a second insulating layer IL2. In some embodiments, the central area 101 may be regarded as an active area of the electronic device 100, but the disclosure is not limited thereto. During a manufacturing process of the electronic device 10, the electronic component 160 may be picked and placed or other components may be aligned by using a plurality of alignment marks AM, but the disclosure is not limited thereto. According to some embodiments, the plurality of alignment marks AM may be disposed on a surface of the substrate 110. According to some embodiments, the plurality of alignment marks AM may be disposed within the substrate 110, i.e., along a normal direction (direction Z) of the substrate 110, there is a spacing between the alignment marks AM and the surface of the substrate 110.

In the embodiment, the electronic device 100 may be applied to a power module, a semiconductor packaging device, a display device, a light-emitting device, a backlight device, an antenna device, a sensing device or a splicing device, but the disclosure is not limited thereto.

Specifically, the substrate 110 has a first surface 110*a*, a second surface 110*b* opposite to the first surface 110*a*, and a side surface 110*c* connecting the first surface 110*a* and the second surface 110*b*. The substrate 110 may include a rigid substrate, a flexible substrate, or a combination thereof. For example, a material of the substrate 110 may include glass, quartz, sapphire, ceramic, wafer, polycarbonate (PC), polyimide (PI), polyethylene terephthalate (PET), other suitable substrate materials, or a combination thereof, but the disclosure is not limited thereto.

The through hole 120 passes through the substrate 110. The through hole 120 is filled with a conductive material CM, and the through hole 120 may be electrically connected to the first circuit structure 140 and the second circuit structure 170. The through hole 120 has a first through hole 121 and a second through hole 122. The first through hole 121 corresponds to the central area 101, and the first through hole 121 may overlap with the electronic component 160 in the direction Z. The second through hole 122 corresponds to the peripheral area 102, and the second through hole 122 does not overlap with the electronic component 160 in the direction Z. The first through hole 121 has a width D1 and a depth L, and the second through hole 122 has a width D2 and the depth L. The width D1 is, for example, the maximum width of the first through hole 121 measured along the direction X, the width D2 is, for example, the maximum width of the second through hole 122 measured along the direction X, and the depth L is, for example, the maximum depth of the first through hole 121 (or the second through hole 122) measured along the direction Z. In the embodiment, the width D2 of the second through hole 122 may be greater than the width D1 of the first through hole 121. In detail, a ratio of the width D2 of the second through hole 122 to the width D1 of the first through hole 121 may be 1.2 to 3 (i.e., $1.2 \leq D2/D1 \leq 3$), so as to release stress or mitigate a warping problem by increasing a copper ratio of the through hole 120 in the peripheral area 102, but the disclosure is not limited thereto. According to some embodiments, the width D2 of the second through hole 122 may be greater than the width D1 of the first through hole 121, so as to improve a lateral heat dissipation capability of the electronic device, but the disclosure is not limited thereto. In the embodiment, a ratio of the width to the depth of the through hole 120 (i.e., a ratio of the width D1 to the depth L of the first through hole 121, or a ratio of the width D2 to the depth L of the second through hole 122) may be 0.01 to 0.5 (i.e., $0.01 \leq D1/L \leq 0.5$ or $0.01 \leq D2/L \leq 0.5$), but the disclosure is not limited thereto. According to some embodiments, the conductive material CM in the through hole 120 is substantially coplanar with the first surface 110*a* and the second surface 110*b* of the substrate 110. Further, along the direction Z, the spacing between the first surface 110*a* of the substrate 110 and the surface of the conductive material CM or the spacing between the second surface 110*b* of the substrate 110 and the surface of the conductive material CM is less than or equal to 10 μm.

In the embodiment, the direction X, the direction Y, and the direction Z are different directions. For example, the direction X is, for example, an extending direction of a section line I-I', and the direction Z is, for example, a normal direction of the substrate 110 or a normal direction of the electronic device 100. The direction X is substantially perpendicular to the direction Z, and the direction X and the direction Z are respectively substantially perpendicular to the direction Y, but the disclosure is not limited thereto.

The buffer layer 130 may at least cover the first surface 110*a* of the substrate 110, the second surface 110*b* of the substrate 110, a portion of an inner wall 1211 of the first through hole 121, and a portion of an inner wall 1221 of the second through hole 122. The buffer layer 130 has a buffering property, and thus may protect the substrate 110 to reduce damage to the substrate 110 (for example, reduce cracks in glass substrate) caused by stress generated by subsequent processes (for example, forming the conductive material CM in the through hole 120, forming the first circuit structure 140, and forming the second circuit structure 170). The A material of the buffer layer 130 may include polyimide, parylene, benzocyclobutene (BCB), epoxy, polycarbonate, polyethylene terephthalate, polyethylene naphthalate (PEN), polymer, other suitable buffer materials, inorganic materials, or combinations thereof, but the disclosure is not limited thereto.

In the embodiment, a toughness of the buffer layer 130 may be 0.1 $kJ/m^2$ to 100 $kJ/m^2$, but the disclosure is not limited thereto. Toughness may be measured, for example, by a standard test method for tensile properties of plastics (ASTM D638). In detail, a component to be subjected to a tensile test is first separated from the electronic device 100; then, two punctuation points are pre-marked on the component, where a distance between the two punctuation marks is referred to as a gage length; then, the component is stretched by using a tensile machine (such as a universal testing machine) so that the gage length is gradually extended during the tensile test. Toughness may be obtained by calculating an area under a stress-strain curve (by using integration).

The buffer layer 130 has a thickness T1. The thickness T1 is, for example, the maximum thickness of the buffer layer 130 covering the first surface 110*a* and the second surface 110*b* of the substrate 110 that is measured along the direction Z, or the thickness T1 is, for example, the maximum thickness of the buffer layer 130 covering the inner wall 1211 of the first through hole 121 and the inner wall 1221 of the second through hole 122 that is measured along the direction X. In the embodiment, the thickness T1 of the buffer layer 130 may be 0.01 μm to 10 μm, but the disclosure is not limited thereto. In the embodiment, a ratio of the thickness T1 of the buffer layer 130 to the width D1 of the first through hole 121 (or the width D2 of the second through hole 122) may be 0.02 to 0.2 (i.e., T1/D1=0.02-0.2 or T1/D2=0.02-0.2). Through the above design, the substrate 110 may be provided with a certain protection to prevent the substrate 110 from breaking, but the disclosure is not limited to this.

The first circuit structure 140 is disposed on the first surface 110*a* of the substrate 110, and the first circuit structure 140 may expose a portion of the buffer layer 130 disposed on the first surface 110*a*. The first circuit structure 140 may be electrically connected to the first through hole 121 or the second through hole 122. The first circuit structure 140 may be electrically connected to the second circuit structure 170 in the direction Z through the through hole 120, thereby shortening a signal transmission path there between to reduce signal loss. The first circuit structure 140 includes a conductive layer 141, a dielectric layer 142, a through hole 143, a conductive layer 144, a dielectric layer 145, a through hole 146, and a conductive layer 147. The conductive layer 141 is disposed on the first surface 110*a* of the substrate 110 and on the buffer layer 130. A portion of the conductive layer 141 may contact and electrically connect the first through hole 121, and another portion of the conductive layer 141 may contact and electrically connect the second through hole 122. The dielectric layer 142, the conductive layer 144, the dielectric layer 145, and the conductive layer 147 are alternately stacked on the conductive layer 141 in sequence along the direction Z. The through hole 143 and the through hole 146 are filled with the conductive material CM, the through hole 143 penetrates through the dielectric layer 142 and electrically connects the conductive layer 144 and the conductive layer 141, and the through hole 146 penetrates through the dielectric layer 145 and electrically connects the conductive layer 147 and the conductive layer 144. In the embodiment, the conductive layer and the dielectric layer may be a single layer or a multi-layer stack, where a material of the conductive layer may include copper, titanium, molybdenum, aluminum or other suitable conductive materials, and a material of the dielectric layer may include polyimide, photosensitive polyimide (PSPI), polybenzoxazole (PBO), epoxy resin, polymer, ajinomoto build-up layer (ABF), silicon oxide (SiOx), silicon nitride (SiNx) or other suitable dielectric materials, but the disclosure is not limited thereto.

In the disclosure, the conductive material CM in the through hole 120, the conductive layers (141, 144, 147) of the first circuit structure 140, or the through holes (143, 146) may include a single layer or multi-layer stacked structure. For example, when the conductive material CM in the through hole 120 and the conductive layer 141 of the first circuit structure 140 include a multi-layer stacked structure, it may include a plurality of sub-layers, where one of the sub-layers may be a seed layer (SL1, SL2), and one sub-layer may be a conductor layer (CL1, CL2), the seed layer SL1 may be disposed on the inner wall (1211, 1221) of the through hole 120, and the seed layer SL2 may be disposed on the first surface 110*a* and the second surface 110*b* of the substrate 110. After forming the seed layer (SL1, SL2), a conductor layer (CL1, CL2) may be formed on the seed layer (SL1, SL2), and a thickness of the conductor layer (CL1, CL2) is thicker than that of the seed layer (SL1, SL2). By providing the seed layer (SL1, SL2), a bonding force between the substrate 110 and the conductive material CM or the conductive layer 141 or electrical characteristics of the electronic device 100 may be improved, but the disclosure is not limited thereto. Materials of the seed layer (SL1, SL2) and the conductor layer (CL1, CL2) may include copper (Cu), titanium (Ti), aluminum (Al), molybdenum (Mo), nickel (Ni), ruthenium (Ru), tantalum (Ta), tungsten (W), nitride, carbide or other conductive materials or any combination thereof, but the disclosure is not limited thereto. According to some embodiments, the conductive material CM and the conductive layer 141 may be made separately, i.e., the seed layer SL2 may be disposed between the conductive material CM and the conductor layer CL2, and in the direction Z, the conductive material CM does not overlap with the first surface 110*a* of the substrate 110, or the conductive material CM does not overlap with the second surface 110*b* of the substrate 110. Through the above design, stress at corners of the substrate 110 may be reduced, and a risk of cracking may be reduced, but the disclosure is not limited thereto.

There is a spacing L1 between two adjacent conductive layers 147. The spacing L1 is, for example, the minimum distance between two adjacent conductive layers 147 measured along the direction X, and the conductive layer 147 may be the conductive layer farthest from the substrate 110 (or the conductive layer closest to the electronic component 160) in the first circuit structure 140.

The dielectric layer 142 and the dielectric layer 145 have a thickness T2. The thickness T2 is, for example, the maximum thickness of the dielectric layer 142 (or the dielectric layer 145) measured along the direction Z. In the embodiment, the thickness T2 of the dielectric layer 142 and the dielectric layer 145 may be 5 mm to 15 mm, but the disclosure is not limited thereto. In the embodiment, the thickness T2 of the dielectric layer 142 or the dielectric layer 145 may be greater than the thickness T1 of the buffer layer 130 (i.e., T2>T1), but the disclosure is not limited thereto.

In the embodiment, the first circuit structure 140 and the second circuit structure 170 may be redistribution layers (RDL) and include at least one conductive layer and at least one dielectric layer (FIG. 1B schematically shows three conductive layers and two dielectric layers, but the disclosure is not limited thereto). The redistribution layer may allow line redistribution and/or further increase a line fan-out area, the redistribution layer may be used to electrically connect different electronic components, the redistribution layer may extend a line to a wider spacing or reroute the line to another line with a different spacing, and/or the redistribution layer may be used as a substrate for electrical interface wiring between one connection and another. For example, a pitch between two adjacent contact pads at one end of the redistribution structure contacting the electronic component may be less than or equal to a pitch between two adjacent contact pads at one end of the redistribution structure away from the electronic component. Therefore, the redistribution structure may adjust a line fan-out condition or electrically connect a circuit structure/electronic component with a first pitch to a circuit structure/electronic component with a second pitch, but the disclosure is not limited thereto. A step of forming the redistribution layer may include providing a stack of at least one conductive layer and at least one dielectric layer, and a method of forming the redistribution layer may include processes such as photolithography, etching, surface treatment, laser, and electroplating. The surface treatment may include roughening or activating a surface of the dielectric layer or a surface of the conductive layer to improve a bonding capability of the dielectric layer or the conductive layer. For example, by improving the surface roughness, a bonding force with the subsequent film layer may be improved.

The conductive element 150 is disposed on the conductive layer 147 of the first circuit structure 140 and in a recess 1471 of the conductive layer 147. The conductive element 150 corresponds to the central area 101. The conductive element 150 may contact and electrically connect the conductive layer 147 of the first circuit structure 140. A material of the conductive element 150 may include tin, copper, nickel, gold, silver, gallium, a combination of the above, an alloy of the above or other suitable materials, but the disclosure is not limited thereto. For example, the conductive element 150 may be, for example, a solder ball, a tin ball or a copper pillar (Cu pillar), but the disclosure is not limited thereto.

The electronic component 160 is disposed on the first circuit structure 140 and corresponds to the central area 101. The electronic component 160 is disposed on the conductive element 150. The electronic component 160 has an active surface 160*a*, a back surface 160*b*, and a side surface 160*c*. The active surface 160*a* faces the first circuit structure 140, the active surface 160*a* and the back surface 160*b* are opposite to each other, and the side surface 160*c* connects the active surface 160*a* and the back surface 160*b*. The electronic component 160 includes pads 161 disposed on the active surface 160*a*. The pads 161 of the electronic component 160 may be electrically connected to the conductive layer 147 of the first circuit structure 140 through the conductive element 150. The electronic component 160 may include a passive component or an active component, such as a chip, a known good die (KGD), a semiconductor structure, a diode, a transistor, a capacitor, a resistor, an inductor, etc., but the disclosure is not limited thereto.

The second circuit structure 170 is disposed on the second surface 110*b* of the substrate 110, and the second circuit structure 170 is located between the substrate 110 and the first pad 180. The second circuit structure 170 may be electrically connected to the first through hole 121 or the second through hole 122. The second circuit structure 170 includes a conductive layer 171, a dielectric layer 172, a through hole 173, a conductive layer 174, a dielectric layer 175, a through hole 176, and a conductive layer 177. The conductive layer 171 is disposed under the second surface 110*b* of the substrate 110 and under the buffer layer 130. A portion of the conductive layer 171 may contact and electrically connect the first through hole 121, and another portion of the conductive layer 171 may contact and electrically connect the second through hole 122. The dielectric layer 172, the conductive layer 174, the dielectric layer 175, and the conductive layer 177 are stacked alternately in sequence along the direction Z under the conductive layer 171. The through hole 173 and the through hole 176 are filled with the conductive material CM. The through hole

173 penetrates through the dielectric layer 172 and electrically connects the conductive layer 174 and the conductive layer 171, and the through hole 176 penetrates through the dielectric layer 175 and electrically connects the conductive layer 177 and the conductive layer 174. In the embodiment, the conductive layer and the dielectric layer may be a single layer or a multi-layer stack, and materials of the conductive layer and the dielectric layer may be the same or similar to the conductive layer and the dielectric layer in the first circuit structure 140, and details thereof are not repeated. In some embodiments, a coefficient of thermal expansion (CTE) of the material of the dielectric layer in the second circuit structure 170 may be the same as or different from a coefficient of thermal expansion of the dielectric layer in the first circuit structure 140, so as to mitigate the warping problem. According to some embodiments, the material and a warping tendency (for example, downward warping) of the dielectric layer in the second circuit structure 170 may be different from the material and a warping tendency (for example, upward warping) of the dielectric layer in the first circuit structure 140, so as to mitigate the warping problem. For example, along the Z direction, when the dielectric layer in the second circuit structure 170 has a warping tendency with both left and right sides warping downward, the warping problem may be mitigated by setting the dielectric layer in the first circuit structure 140 to have a warping tendency with both left and right sides warping upward.

There is a spacing L2 between two adjacent conductive layers 177. The spacing L2 is, for example, the minimum distance between two adjacent conductive layers 177 measured along the direction X, and the conductive layer 177 may be the conductive layer farthest from the substrate 110 (or the conductive layer closest to the first pad 180) in the second circuit structure 170. In the embodiment, the spacing L1 between two adjacent conductive layers 147 in the first circuit structure 140 is smaller than the spacing L2 between two adjacent conductive layers 177 in the second circuit structure 170, but the disclosure is not limited thereto.

The dielectric layer 172 and the dielectric layer 175 have a thickness T3. The thickness T3 is, for example, the maximum thickness of the dielectric layer 172 (or the dielectric layer 175) measured along the direction Z. In the embodiment, the thickness T3 of the dielectric layer 172 and the dielectric layer 175 may be 5 mm to 15 mm, but the disclosure is not limited thereto. In the embodiment, the thickness T3 of the dielectric layer 172 or the dielectric layer 175 may be greater than the thickness T1 of the buffer layer 130 (i.e., T3>T1), but the disclosure is not limited thereto.

The conductive layer 171 may include a conductive layer 1711 disposed corresponding to the central area 101 and a conductive layer 1712 disposed corresponding to the peripheral area 102. The conductive layer 1711 has a thickness T4, and the conductive layer 1712 has a thickness T5. The thickness T4 is, for example, the maximum thickness of the conductive layer 1711 measured along the direction Z, and the thickness T5 is, for example, the maximum thickness of the conductive layer 1711 measured along the direction Z. In the embodiment, the thickness T5 of the conductive layer 1712 may be greater than or equal to 1.5 times the thickness T4 of the conductive layer 1711 (i.e., T5≥1.5×T4) for shielding EMI or grounding, but the disclosure is not limited thereto.

In the embodiment, the conductive layer 1712 may be a double-layer stack formed by electroplating and/or copper foil. The conductive layer 1712 may include a first layer 1712*a* and a second layer 1712*b*, where the first layer 1712*a* contacts the first through hole 121, the second layer 1712*b* is disposed under the first layer 1712*a*, and the second layer 1712*b* surrounds a side surface of the first layer 1712*a*. For example, after the first layer 1712*a* is formed by electroplating, a copper foil serving as the second layer 1712*b* may be attached under the first layer 1712*a*; or after the first layer 1712*a* is formed by electroplating, a surface of the first layer 1712*a* may be roughened first, and then the copper foil serving as the second layer 1712*b* is attached under the roughened first layer 1712*a* to improve a bonding strength. In some embodiments, the copper foil serving as the second layer 1712*b* may be used for shielding EMI or grounding, but the disclosure is not limited thereto.

The first pad 180 is disposed on the second surface 110*b* of the substrate 110. The first pad 180 may be electrically connected to the electronic component 160 through the through hole 120 and the first circuit structure 140. The first pad 180 may be a solder ball or a tin ball, but the disclosure is not limited thereto. In addition, in the embodiment, the first pad 180 may be disposed under the conductive layer 177 of the second circuit structure 170 and in a recess 1771 of the conductive layer 177, and the first pad 180 may be electrically connected to the through hole 120 through the second circuit structure 170, but the disclosure is not limited thereto. In some embodiments, the second circuit structure may be omitted depending on demands or design requirements, and the first pad may be in contact with or electrically connected to the through hole through other components.

The first insulating layer IL1 is disposed between the electronic component 160 and the first circuit structure 140. The first insulating layer IL1 may surround the conductive element 150 and the conductive layer 147. In the cross-sectional view of the electronic device 100, the first insulating layer IL1 may at least contact a side surface of the conductive element 150 and a side surface of the conductive layer 147. In the embodiment, the first insulating layer IL1 may include an organic material or an inorganic material. The organic material may be an underfill or other suitable polymer material for fixing the electronic component 160, but the disclosure is not limited thereto. The inorganic material may include silicon oxide, silicon nitride or other suitable materials for fixing the electronic component 160 or adjusting the warpage of the electronic device, but the disclosure is not limited thereto.

The second insulating layer IL2 is disposed on the first surface 110*a* of the substrate 110, and the second insulating layer IL2 surrounds the electronic component 160 and the first circuit structure 140. In the cross-sectional view of the electronic device 100, the second insulating layer IL2 may at least contact the side surface 160*c* of the electronic component 160 and a side surface 140*a* of the first circuit structure 140. The second insulating layer IL2 may contact the buffer layer 130. In the present embodiment, the second insulating layer IL2 may include an organic material or an inorganic material. The organic material may be a molding layer. The inorganic material may include silicon oxide, silicon nitride or other suitable materials for protecting the electronic component 160 or isolating moisture, but the disclosure is not limited thereto.

In the embodiment, a manufacturing method of the electronic device 100 may include but is not limited to the following steps and the order of the steps: providing the substrate 110, where the substrate 110 has the first surface 110*a* and the second surface 110*b* opposite to the first surface 110*a*; drilling the substrate 110 by a method such as laser modification or etching to form the through hole 120, where the through hole 120 penetrates through the substrate 110, and the through hole 120 has the first through hole 121 and the second through hole 122, and the width D2 of the second through hole 122 is greater than the width D1 of the first through hole 121; forming the buffer layer 130, where the buffer layer 130 covers the first surface 110*a*, the second surface 110*b*, the inner wall 1211 of the first through hole 121, and the inner wall 1221 of the second through hole 122; after depositing a seed layer (not shown) on the inner wall (1211, 1221) of the through hole 120, forming the conductive material CM in the through hole 120 by, for example, electroplating or chemical plating; respectively forming the first circuit structure 140 and the second circuit structure 170 on the first surface 110*a* and under the second surface 110*b* by, for example, yellow light, etching, surface treatment, laser, electroplating, etc.; bonding the electronic component 160 to the first circuit structure 140 through the conductive element 150; forming the first pad 180 under the second circuit structure 170, where the first pad 180 is electrically connected to the electronic component 160 through the second circuit structure 170, the through hole 120, the first circuit structure 140 and the conductive element 150; forming the first insulating layer IL1 between the electronic component 160 and the first circuit structure 140; and forming the second insulating layer IL2, where the second insulating layer IL2 surrounds the electronic component 160 and the first circuit structure 140.

In the embodiment, the manufacturing method of the electronic device 100 may be applied, for example, to a wafer-level package (WLP) process or a panel-level package (PLP) process, and may be a chip first or chip last redistribution layer first (RDL first) manufacturing method.

Other embodiments will be listed below for illustration. It should be noticed that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 2:
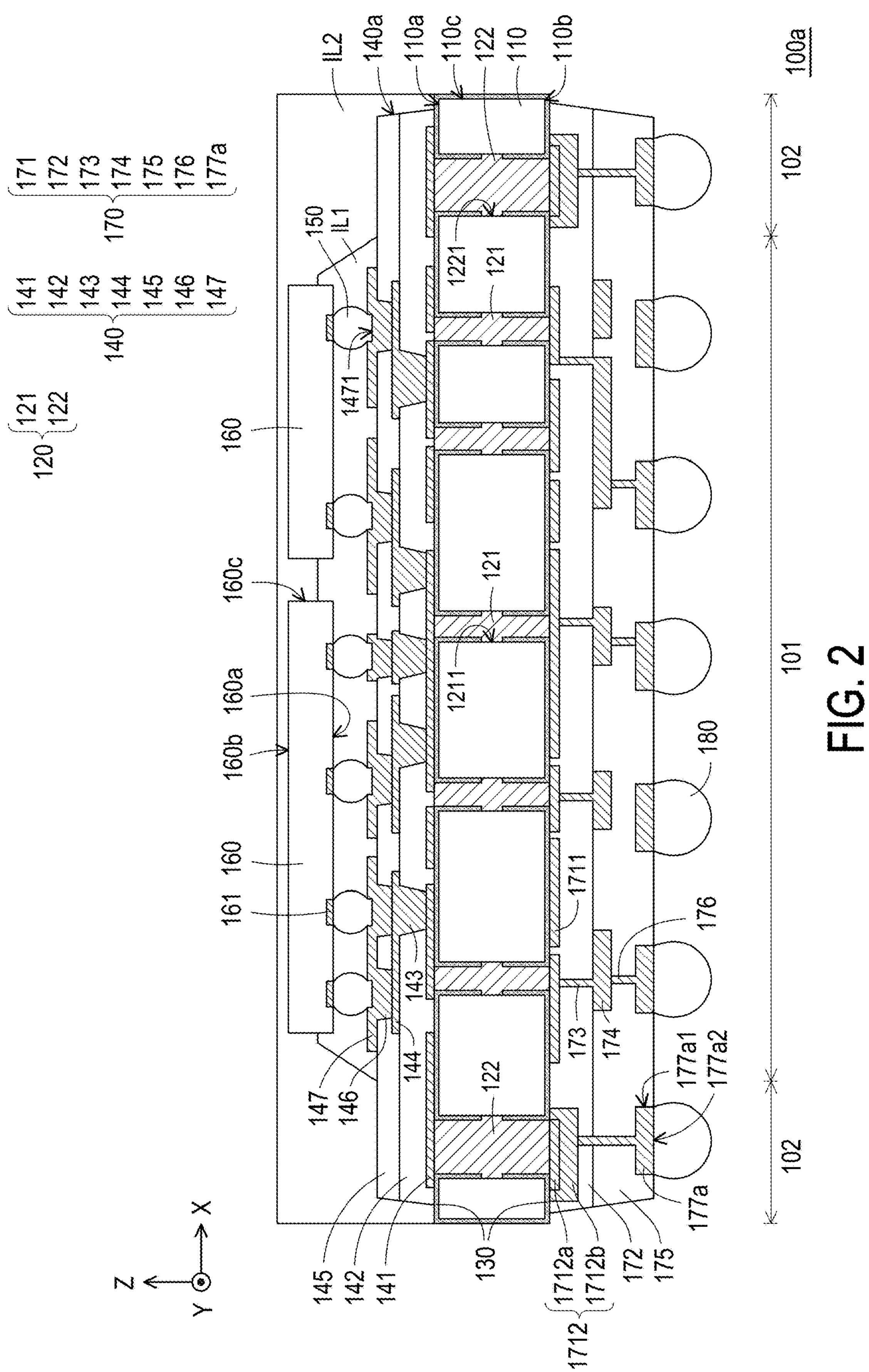
FIG. 2 is a schematic cross-sectional view of an electronic device according to a second embodiment of the disclosure.

FIG. 2 is a schematic cross-sectional view of an electronic device according to a second embodiment of the disclosure. Referring to FIG. 2 and FIG. 1B at the same time, an electronic device 100*a* of the embodiment is similar to the electronic device 100 of FIG. 1B, and a difference there between is that: in the electronic device 100*a* of the embodiment, the conductive layer 177*a* of the second circuit structure 170 is embedded in the dielectric layer 175. In addition, the buffer layer 130 may at least cover the side surface 110*c* of the substrate 110. In this way, by covering at least a portion of the side surface 110*c* of the substrate 110 with the buffer layer 130, the risk of the substrate 110 being broken during a singulation or cutting process may be reduced.

Specifically, referring to FIG. 2, in the cross-sectional view of the electronic device 100*a*, the dielectric layer 175 may surround the conductive layer 177*a*, the dielectric layer 175 may at least contact a side surface 177*a*1 of the conductive layer 177*a*, and a surface 177*a*2 of the conductive layer 177*a* facing away from the substrate 110 is exposed outside the dielectric layer 175.

Figure 3:
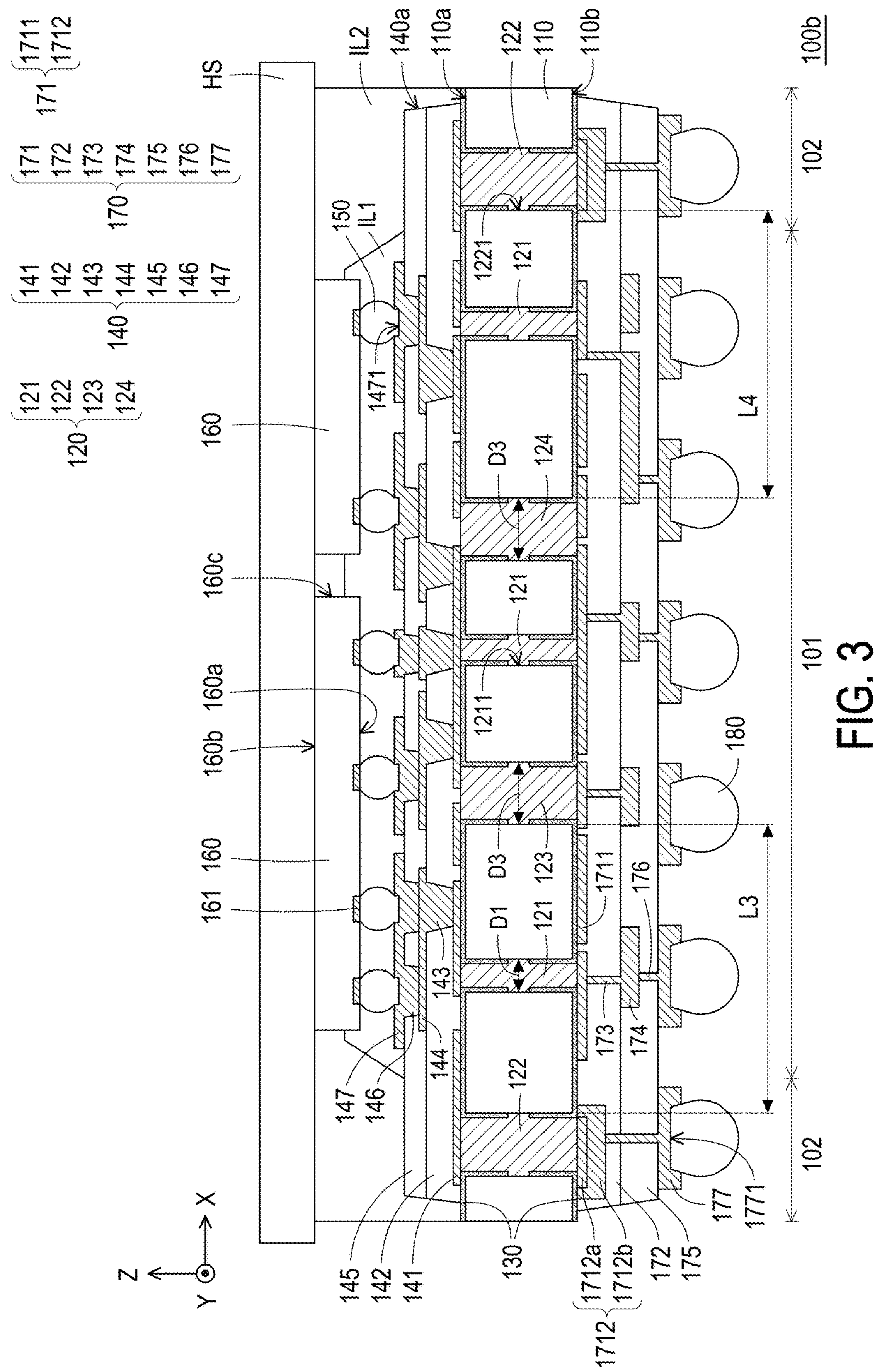
FIG. 3 is a schematic cross-sectional view of an electronic device according to a third embodiment of the disclosure.

FIG. 3 is a schematic cross-sectional view of an electronic device according to a third embodiment of the disclosure. Referring to FIG. 3 and FIG. 1B at the same time, an electronic device 100*b* of the embodiment is similar to the electronic device 100 of FIG. 1B, and a difference there between is that the electronic device 100*b* of the embodiment further includes a heat sink HS, and the through hole 120 further includes a third through hole 123 and a fourth through hole 124.

Specifically, referring to FIG. 3, the third through hole 123 and the fourth through hole 124 correspond to the central area 101. There is a distance L3 between the third through hole 123 and the closest second through hole 122, and a distance L4 between the fourth through hole 124 and the closest second through hole 122. The distance L3 is, for example, the minimum distance between the third through hole 123 and the closest second through hole 122 measured along the direction X, and the distance L4 is, for example, the minimum distance between the fourth through hole 124 and the closest second through hole 122 measured along the direction X. In the embodiment, a ratio of the distance L3 to the distance L4 may be greater than or equal to 0.8 and less than or equal to 1.2 (i.e., $0.8 \leq L3/L4 \leq 1.2$), so that the third through hole 123 and the fourth through hole 124 adjacent to each other in the direction X may be substantially and symmetrically arranged, and the stress on the left and right sides of the substrate 110 may be balanced to mitigate the warping problem, but the disclosure is not limited thereto.

The third through hole 123 and the fourth through hole 124 have a width D3 and a depth L. The width D3 is, for example, the maximum width of the third through hole 123 (or the fourth through hole 124) measured along the direction X, and the depth L is, for example, the maximum depth of the third through hole 123 (or the fourth through hole 124) measured along the direction Z. In the embodiment, the width D3 of the third through hole 123 (or the fourth through hole 124) may be greater than the width D1 of the first through hole 121 for heat dissipation or for transmitting a larger voltage signal, but the disclosure is not limited thereto. In the embodiment, a ratio of the width D3 to the depth L of the third through hole 123 (or the fourth through hole 124) may be 0.01 to 0.5 (i.e., D3/L=0.01-0.5), but the disclosure is not limited thereto.

The heat sink HS is disposed on the back surface 160*b* of the electronic component 160 to conduct heat generated by the electronic component 160 to the outside. According to some embodiments, a side of the heat sink HS away from the electronic component 160 may have a fin or groove design to improve a heat dissipation effect, but the disclosure is not limited thereto.

Figure 4:
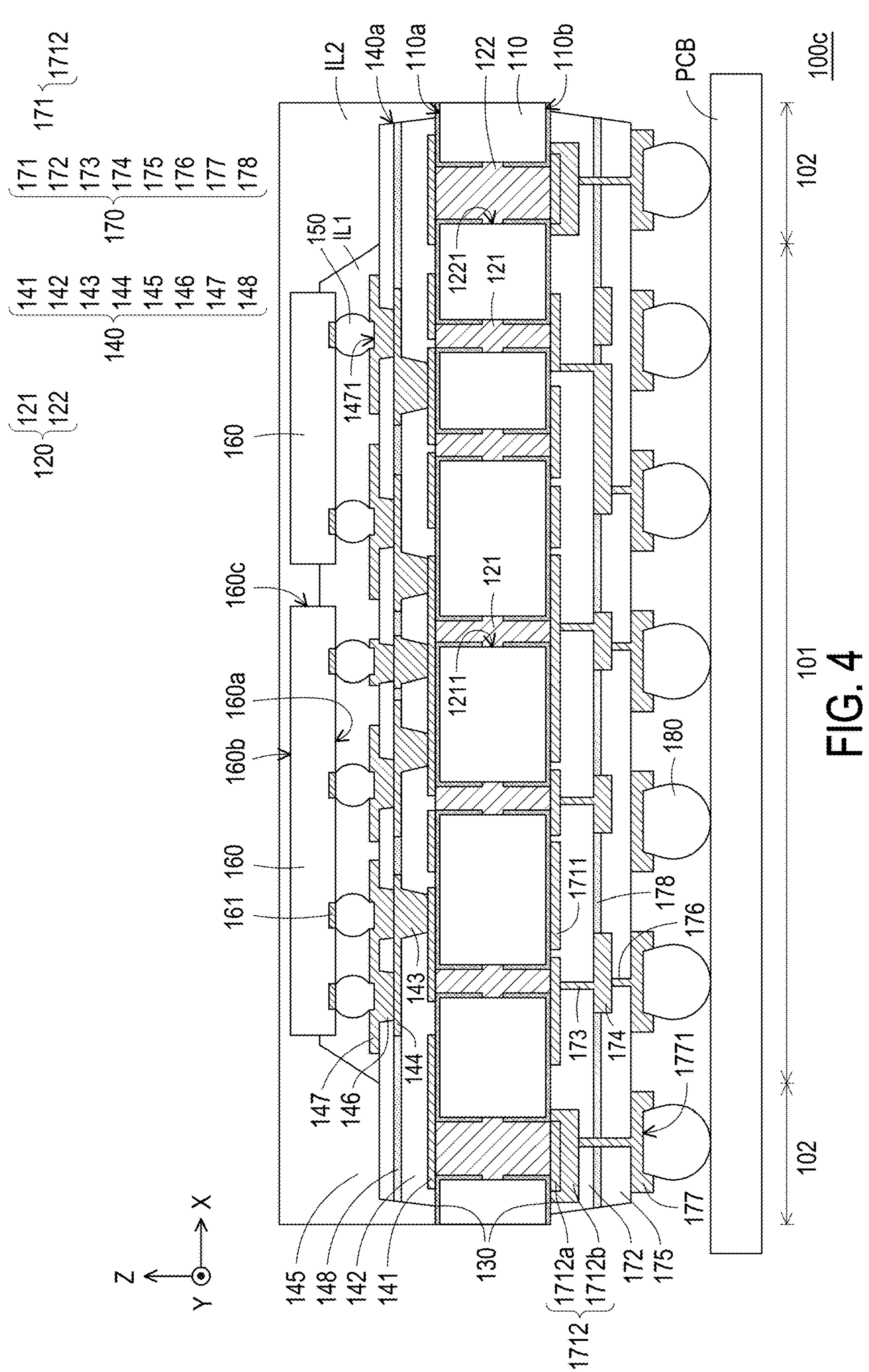
FIG. 4 is a schematic cross-sectional view of an electronic device according to a fourth embodiment of the disclosure.

FIG. 4 is a schematic cross-sectional view of an electronic device according to a fourth embodiment of the disclosure. Referring to FIG. 4 and FIG. 1B at the same time, an electronic device 100*c* of the embodiment is similar to the electronic device 100 of FIG. 1B, and a difference there between is that the electronic device 100*c* of the present embodiment further includes a circuit board PCB, the first circuit structure 140 further includes an anti-warping layer 148, and the second circuit structure 170 further includes an anti-warping layer 178.

Specifically, referring to FIG. 4, in the first circuit structure 140, the anti-warping layer 148 is disposed on the dielectric layer 142, and the anti-warping layer 148 is disposed at a junction between the dielectric layer 145 and the dielectric layer 142. A part of the anti-warping layer 148 may also be disposed between two adjacent conductive layers 144. In the embodiment, a material and a warping tendency (for example, downward warping) of the anti-warping layer 148 may be different from a material and a warping tendency (for example, upward warping) of the dielectric layer in the first circuit structure 140, so as to mitigate the warping problem.

In the second circuit structure 170, the anti-warping layer 178 is disposed under the dielectric layer 172, and the anti-warping layer 178 is disposed at a junction between the dielectric layer 175 and the dielectric layer 172. A part of the anti-warping layer 178 may also be disposed between two adjacent conductive layers 174. In the embodiment, a material and a warping tendency (for example, upward warping) of the anti-warping layer 178 may be different from a material and a warping tendency (for example, downward warping) of the dielectric layer in the second circuit structure 170, so as to mitigate the warping problem.

In the embodiment, the material of the anti-warping layer 148 may be the same as or different from the material of the anti-warping layer 178, but the disclosure is not limited thereto.

A printed circuit board PCB is disposed under the first pad 180, and the printed circuit board PCB may be electrically connected to the first pad 180. In the embodiment, the electronic component 160 may be electrically connected to the printed circuit board PCB through the conductive element 150, the first circuit structure 140, the through hole 120, the second circuit structure 170 and the first pad 180.

Figure 5:
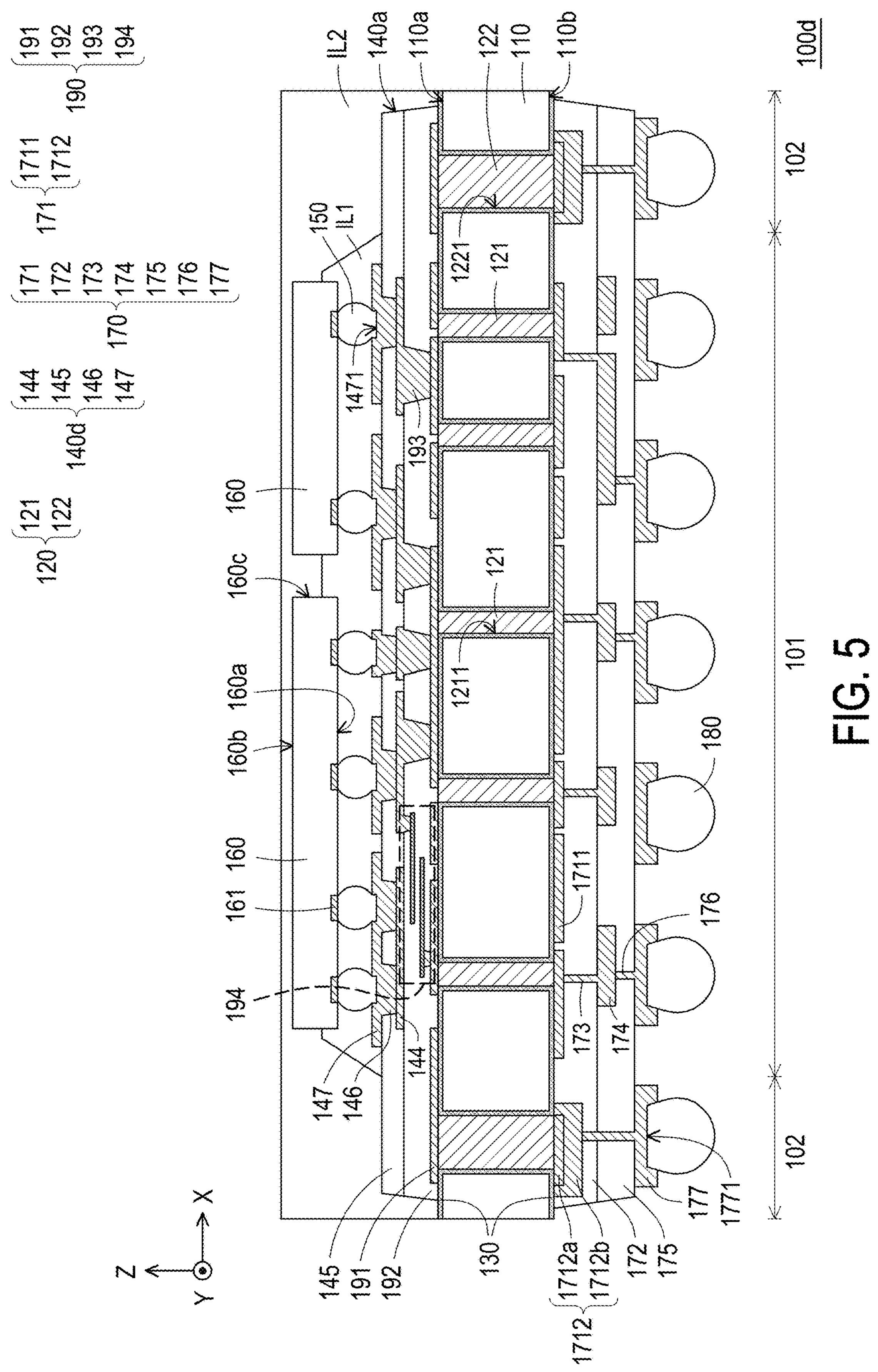
FIG. 5 is a schematic cross-sectional view of an electronic device according to a fifth embodiment of the disclosure.

FIG. 5 is a schematic cross-sectional view of an electronic device according to a fifth embodiment of the disclosure. Referring to FIG. 5 and FIG. 1B at the same time, an electronic device 100*d* of the embodiment is similar to the electronic device 100 of FIG. 1B, and a difference there between is that the electronic device 100*d* of the embodiment further includes a component integration layer 190, and the buffer layer 130 may completely cover the inner wall 1211 of the first through hole 121 and the inner wall 1221 of the second through hole 122.

Specifically, referring to FIG. 5, a first circuit structure 140*d* is disposed on the component integration layer 190, and the first circuit structure 140*d* includes a conductive layer 144, a dielectric layer 145, a through hole 146, and a conductive layer 147. The conductive layer 144 is disposed on the component integration layer 190, the dielectric layer 145 is disposed on the conductive layer 144, the conductive layer 147 is disposed on the dielectric layer 145, and the through hole 146 penetrates through the dielectric layer 145 and electrically connects the conductive layer 147 and the conductive layer 144.

The component integration layer 190 is disposed between the first circuit structure 140*d* and the substrate 110, and the component integration layer 190 includes a conductive layer 191, a dielectric layer 192, a through hole 193, and a component 194. The conductive layer 191 is disposed on the buffer layer 130, the dielectric layer 192 is disposed on the conductive layer 191, the through hole 193 penetrates through the dielectric layer 192 and electrically connects the conductive layer 144 and the conductive layer 191, and the component 194 is disposed in the dielectric layer 145. The component 194 may overlap with the electronic component 160 in the direction Z, thereby shortening a signal transmission path there between to reduce signal loss or achieve an energy saving effect.

In the embodiment, a dissipation factor (Df) of the dielectric layer 192 in the component integration layer 190 may be different from a dissipation factor of the dielectric layer 145 in the first circuit structure 140*d*, and the dissipation factor of the dielectric layer 192 may be smaller than the dissipation factor of the dielectric layer 145 to form a better capacitance, but the disclosure is not limited thereto.

In the embodiment, the component 194 may be an active component, a passive component or other suitable components. In some embodiments, the passive component may also be a capacitor, a resistor or an inductor. In some embodiments, the active component may also be a transistor or a thin film transistor.

Figure 6:
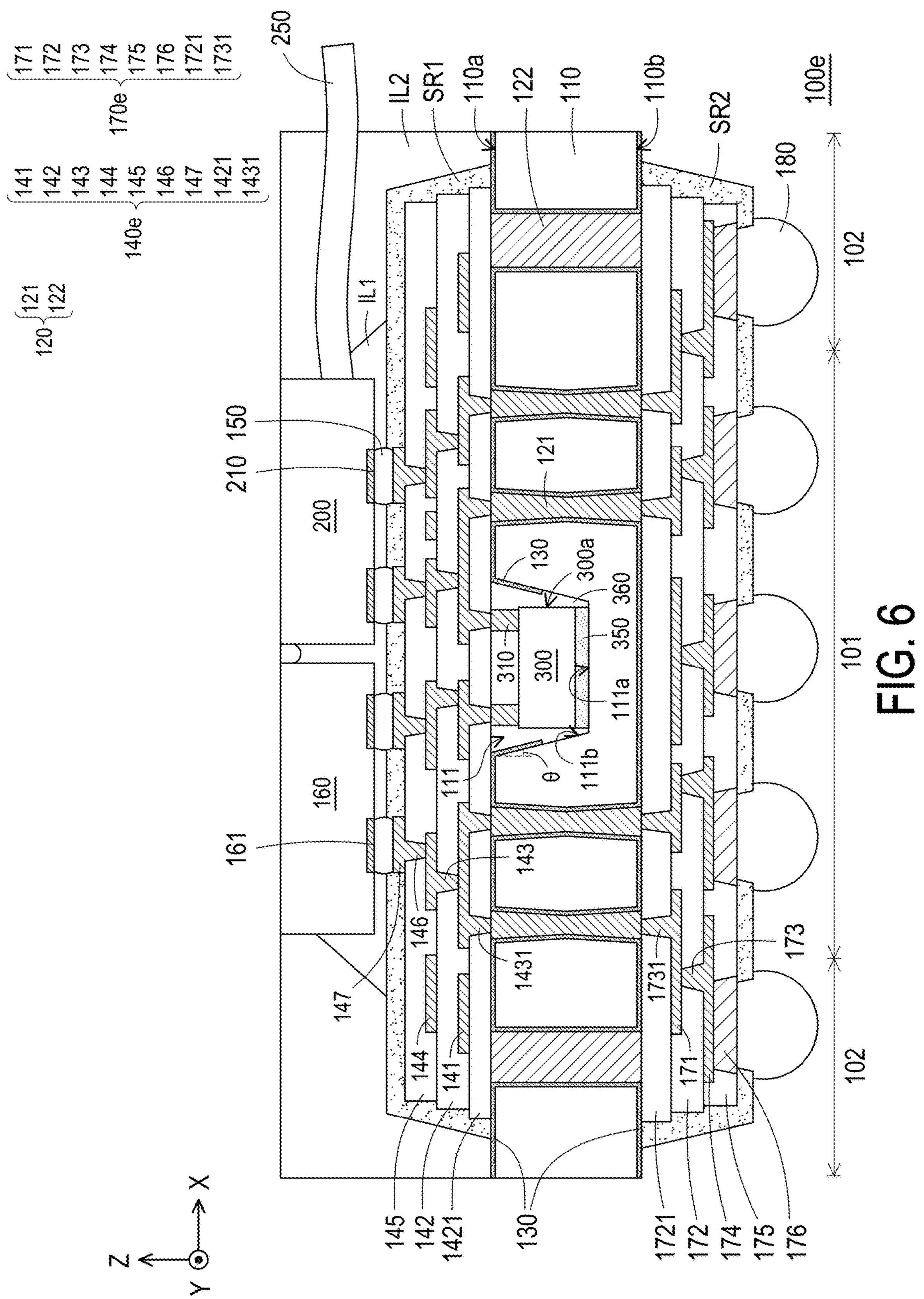
FIG. 6 is a schematic cross-sectional view of an electronic device according to a sixth embodiment of the disclosure.

FIG. 6 is a schematic cross-sectional view of an electronic device according to a sixth embodiment of the disclosure. Referring to FIG. 6 and FIG. 1B at the same time, an electronic device 100*e* of the embodiment is similar to the electronic device 100 of FIG. 1B, and a difference there between is that the electronic device 100*e* of the embodiment further includes an electronic component 200, an optical fiber 250, an electronic component 300, a solder resist layer SR1 and a solder resist layer SR2, and the substrate 110 includes a groove 111 recessed in the first surface 110*a*.

Specifically, referring to FIG. 6, a first circuit structure 140*e* further includes a dielectric layer 1421 and a through hole 1431. The dielectric layer 1421 is disposed between the dielectric layer 142 and the first surface 110*a* of the substrate 110. The through hole 1431 is filled with a conductive material CM, and the through hole 1431 penetrates through the dielectric layer 1421 to electrically connect the conductive layer 141 and the first through hole 121.

A second circuit structure 170*e* further includes a dielectric layer 1721 and a through hole 1731. The dielectric layer 1721 is disposed between the second surface 110*b* of the substrate 110 and the dielectric layer 172. The through hole 1731 is filled with a conductive material CM, and the through hole 1731 penetrates through the dielectric layer 1721 to electrically connect the first through hole 121 and the conductive layer 171.

The solder resist layer SR1 and the solder resist layer SR2 may respectively cover and surround the first circuit structure 140*e* and the second circuit structure 170*e*. The solder resist layer SR1 and the solder resist layer SR2 may be respectively configured to protect the first circuit structure 140*e* and the second circuit structure 170*e* to block external water and oxygen, or avoid affecting the first circuit structure 140*e* and the second circuit structure 170*e* when manufacturing the conductive element 150.

The electronic component 200 is disposed on the first circuit structure 140*e* and the conductive element 150, and the electronic component 200 corresponds to the central area 101. The pad 210 of the electronic component 200 may be electrically connected to the conductive layer 147 of the first circuit structure 140*e* through the conductive element 150. In addition, the electronic component 200 may also be electrically connected to the optical fiber 250. In the embodiment, the electronic component 200 may be a silicon photonic chip (PIC), but the disclosure is not limited thereto.

The groove 111 corresponds to the central area 101, and the groove 111 has a bottom surface 111*a* and an inner wall 111*b*. The buffer layer 130 may cover a portion of the inner wall 111*b* of the groove 111. The adhesive layer 350 is disposed on the bottom surface 111*a* of the groove 111. The underfill 360 is filled in the groove 111. According to some embodiments, an angle θ between the inner wall 111*b* of the groove 111 and the direction Z may be between 20 degrees and 60 degrees, making it easier to place the electronic component 300, but the disclosure is not limited thereto.

The electronic component 300 is embedded and fixed in the groove 111 through the adhesive layer 350, and the electronic component 300 is arranged corresponding to the central area 101. The pad 310 of the electronic component 300 may be electrically connected to the through hole 1431 of the first circuit structure 140*e*. In the embodiment, the electronic component 300 may be a connector for processing signals between the electronic component 160 and the electronic component 200, but the disclosure is not limited thereto. According to some embodiments, the adhesive layer 350 may contact a side surface 300*a* of the electronic component 300 to fix the electronic component 300, but the disclosure is not limited thereto.

In summary, in the electronic device of the disclosure, since the width of the second through hole corresponding to the peripheral area may be greater than the width of the first through hole corresponding to the central area, the copper ratio of the through hole in the peripheral area may be increased to release stress or mitigate the warping problem. Since the buffer layer with buffering properties covers the first surface of the substrate, the second surface of the substrate, the inner wall of the first through hole and the inner wall of the second through hole, the substrate may be protected to reduce damage to the substrate caused by stresses generated by subsequent processes. Since the warping tendency of the second circuit structure may be different from the warping tendency of the first circuit structure, the warping problem may be mitigated. Since the warping tendency of the anti-warping layer in the circuit structure may be different from the warping tendency of the dielectric layer in the circuit structure, the warping problem may be mitigated. Since the component in the component integration layer may overlap with the electronic component, the signal transmission path there between may be shortened, thereby reducing signal loss or achieving the energy saving effect.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. An electronic device, having a central area and a peripheral area surrounding the central area, and comprising:

a substrate, having a first surface and a second surface opposite to the first surface;

a through hole, penetrating through the substrate, and having a first through hole and a second through hole;

a buffer layer, covering the first surface, the second surface, an inner wall of the first through hole and an inner wall of the second through hole;

a first circuit structure, disposed on the first surface;

an electronic component, disposed on the first circuit structure and corresponding to the central area; and a first pad, disposed on the second surface, and electrically connected to the electronic component through the through hole and the first circuit structure, wherein the first through hole corresponds to the central area, the second through hole corresponds to the peripheral area, and a width of the second through hole is greater than a width of the first through hole.

2. The electronic device as claimed in claim 1, wherein a ratio of the width of the second through hole to the width of the first through hole is 1.2 to 3.

3. The electronic device as claimed in claim 1, wherein the first through hole overlaps with the electronic component, and the second through hole does not overlap with the electronic component.

4. The electronic device as claimed in claim 1, wherein a toughness of the buffer layer is 0.1 $kJ/m^2$ to 100 $KJ/m^2$.

5. The electronic device as claimed in claim 1, wherein a ratio of a thickness of the buffer layer to a width of the through hole is 0.02 to 0.2.

6. The electronic device as claimed in claim 1, wherein a thickness of the dielectric layer in the first circuit structure is greater than a thickness of the buffer layer.

7. The electronic device as claimed in claim 1, further comprising:

a second circuit structure, disposed on the second surface, and located between the substrate and the first pad.

8. The electronic device as claimed in claim 7, wherein a distance between two adjacent conductive layers in the first circuit structure is smaller than a distance between two adjacent conductive layers in the second circuit structure.

9. The electronic device as claimed in claim 7, wherein the first circuit structure is electrically connected to the second circuit structure through the through hole.

10. The electronic device as claimed in claim 7, wherein a warping tendency of a dielectric layer in the first circuit structure is different from a warping tendency of a dielectric layer in the second circuit structure.

11. The electronic device as claimed in claim 7, wherein a thickness of the dielectric layer in the second circuit structure is greater than a thickness of the buffer layer.

12. The electronic device as claimed in claim 7, wherein the second circuit structure comprises a conductive layer and another conductive layer, the conductive layer corresponds to the central area, the another conductive layer corresponds to the peripheral area, and a thickness of the another conductive layer is greater than or equal to 1.5 times of a thickness of the conductive layer.

13. The electronic device as claimed in claim 7, wherein the first pad is electrically connected to the through hole through the second circuit structure.

14. The electronic device as claimed in claim 1, further comprising:

a first insulating layer, disposed between the electronic component and the first circuit structure.

15. The electronic device as claimed in claim 1, further comprising:

a second insulating layer, surrounding the electronic component and the first circuit structure.

16. The electronic device as claimed in claim 15, wherein the second insulating layer contacts the buffer layer.

17. The electronic device as claimed in claim 1, wherein the through hole further has a third through hole corresponding to the central area, and a width of the third through hole is greater than the width of the first through hole.

18. The electronic device as claimed in claim 1, wherein the first circuit structure comprises an anti-warping layer and a dielectric layer, and a warping tendency of the anti-warping layer is different from a warping tendency of the dielectric layer.

19. The electronic device as claimed in claim 1, further comprising:

a component integration layer, disposed between the first circuit structure and the substrate, wherein the component integration layer comprises a component, and the component overlaps with the electronic component.

20. The electronic device as claimed in claim 1, further comprising:

another electronic component, disposed in a groove of the substrate and corresponding to the central area.

* * * * *